(12) United States Patent  
Nakane et al.

(10) Patent No.: US 12,431,335 B2
(45) Date of Patent: Sep. 30, 2025

(54) SUBSTRATE PROCESSING METHOD AND SUBSTRATE PROCESSING APPARATUS

(71) Applicant: Tokyo Electron Limited, Tokyo (JP)

(72) Inventors: Yuta Nakane, Miyagi (JP); Sho Kumakura, Miyagi (JP); Shinya Ishikawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 205 days.

(21) Appl. No.: 17/701,497

(22) Filed: Mar. 22, 2022

(65) Prior Publication Data

US 2022/0384151 A1 Dec. 1, 2022

(30) Foreign Application Priority Data

Mar. 22, 2021 (JP) ................... 2021-046890

(51) Int. Cl.
*C23F 4/00* (2006.01)
*H01J 37/32* (2006.01)
*H01L 21/311* (2006.01)

(52) U.S. Cl.
CPC .......... *H01J 37/32449* (2013.01); *C23F 4/00* (2013.01); *H01J 37/32082* (2013.01); *H01J 37/32862* (2013.01); *H01J 2237/3346* (2013.01); *H01J 2237/335* (2013.01); *H01L 21/31122* (2013.01); *H01L 21/31144* (2013.01)

(58) Field of Classification Search
CPC .......................... H01J 37/32449; C23F 4/00; H01L 21/31122; H01L 21/31144
See application file for complete search history.

(56) References Cited

U.S. PATENT DOCUMENTS

| | | | |
|---|---|---|---|
| 5,419,805 A * | 5/1995 | Jolly ................. | H01L 21/32136 438/720 |
| 7,012,027 B2 | 3/2006 | Perng et al. | |
| 2016/0300728 A1* | 10/2016 | Mikami ............. | H01C 17/003 |
| 2018/0218902 A1* | 8/2018 | Venkatasubramanian ................... H01L 21/31111 |
| 2018/0345330 A1* | 12/2018 | Zhai ......................... | B08B 9/00 |
| 2022/0344136 A1* | 10/2022 | Peter ................ | H01J 37/32522 |

OTHER PUBLICATIONS

Bae et al. Jpn J. Appl. Phys. vol. 42, "High-Rate Dry Etching of ZnO in BCl3/CH4/H2 Plasma", pp. L535-L537). (Year: 2003).*

* cited by examiner

*Primary Examiner* — Binh X Tran
(74) *Attorney, Agent, or Firm* — PROCOPIO, CORY, HARGREAVES & SAVITCH LLP

(57) ABSTRACT

In one exemplary embodiment, a substrate processing method is provided. This substrate processing method comprises the steps of: providing a substrate including a metal compound film and a mask defining an opening on the metal compound film to a plasma processing chamber; and etching the metal compound film by forming a plasma from a first processing gas including a boron- and halogen-containing gas and a hydrogen-containing gas.

21 Claims, 8 Drawing Sheets

SUBSTRATE PROCESSING METHOD AND SUBSTRATE PROCESSING APPARATUS

BACKGROUND

Exemplary embodiments of the present disclosure relate to a substrate processing method and a substrate processing apparatus.

Related Art

As semiconductor devices become smaller, materials with a high relative permittivity (high-κ) will be used more frequently. Known high-κ materials include metal compounds such as hafnium dioxide ($HfO_2$) and zirconium oxide (ZrO).

Patent Document 1 discloses a method in which plasma is formed using a processing gas that is a mixture of a halogen-based gas and an oxidant gas ($O_2$, CO, $CO_2$, $N_2O$) to etch high-κ materials such as hafnium dioxide ($HfO_2$).

Citation List

Patent Literature

[Patent Document 1] U.S. Pat. No. 7,012,027 B2

SUMMARY

In one exemplary embodiment, a substrate processing method comprises the steps of: providing a substrate including a metal compound film and a mask defining an opening on the metal compound film to a plasma processing chamber; and etching the metal compound film by forming a plasma from a first processing gas including a boron- and halogen-containing gas and a hydrogen-containing gas.

DETAILED DESCRIPTION

Figure 1:
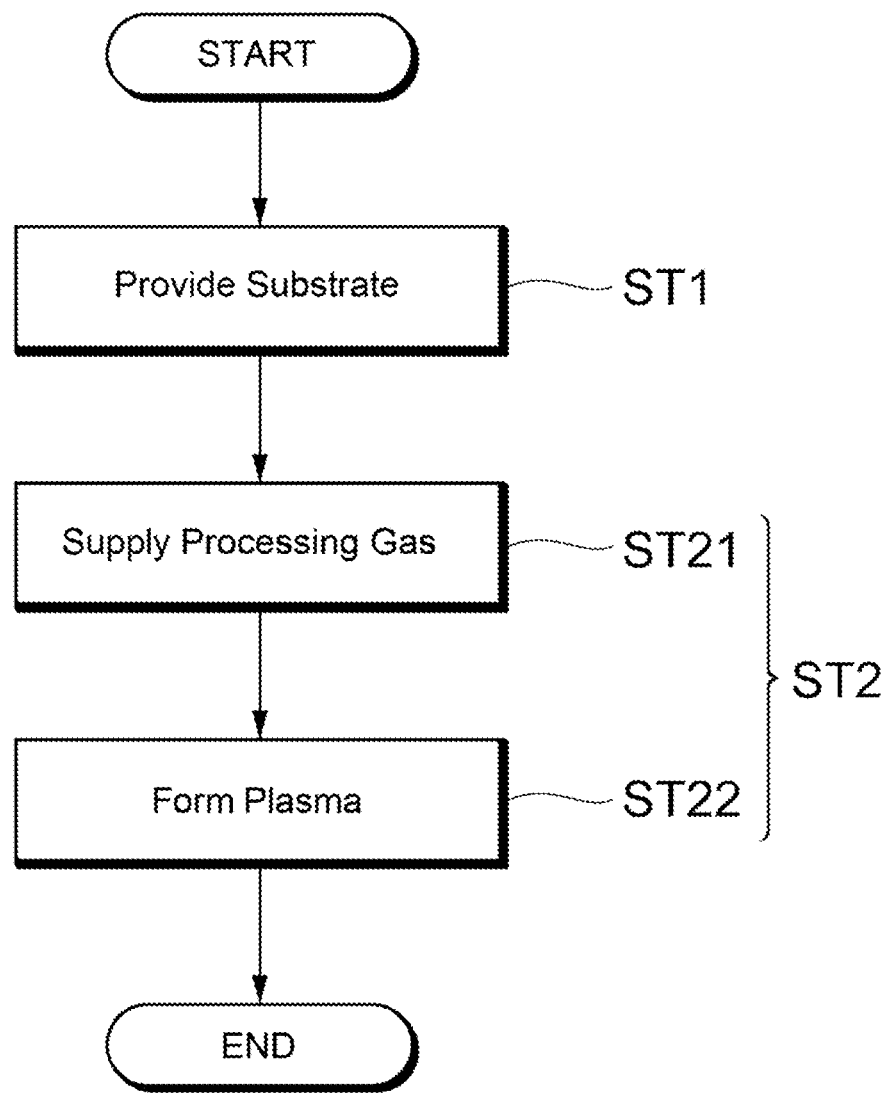
FIG. 1 is a flowchart showing the substrate processing method in an exemplary embodiment.

Exemplary embodiments will now be described.

In one exemplary embodiment, a substrate processing method is provided. This substrate processing method comprises the steps of: providing a substrate including a metal compound film and a mask defining an opening on the metal compound film to a plasma processing chamber; and etching the metal compound film by forming a plasma from a first processing gas including a boron- and halogen-containing gas and a hydrogen-containing gas.

This embodiment can selectively etch the metal compound film while suppressing damage to the mask by using a processing gas that includes a hydrogen-containing gas in addition to boron- and halogen-containing gas. In other words, the metal compound film can be etched with a higher degree of selectivity than the mask.

In another exemplary embodiment, the metal compound film is formed from an oxide, nitride, silicate, or oxynitride of Zr, Hf, Ta, Ti, Al, Y, La, W, Mo, Ni, Ru, or Co.

In another exemplary embodiment, the metal compound film is a high-κ film.

In another exemplary embodiment, the boron- and halogen-containing gas includes $BCl_3$ gas, a mixed gas of $BH_3$ gas and $Cl_2$ gas, a mixed gas of $B(CH_3)_3$ gas and $Cl_2$ gas, or a mixed gas of $(CH_3CH_2)_3B$ gas and $Cl_2$ gas.

In another exemplary embodiment, the hydrogen-containing gas includes hydrogen gas, hydrocarbon gas, or hydrofluorocarbon gas.

In another exemplary embodiment, the ratio of the volume of the hydrogen-containing gas to the total volume of the boron- and halogen-containing gas and the hydrogen-containing gas is from 10 to 30%. Here, the metal compound film can be etched with a higher degree of selectivity than both the organic film and the Si-containing dielectric film.

In another exemplary embodiment, the step of providing a substrate comprises the steps of: placing the substrate on a substrate support in the plasma processing chamber; and supplying bias radio-frequency (RF) power to the substrate support so that the average energy of the ions incident on the metal compound film is 100 eV or less.

In another exemplary embodiment, the substrate processing method further comprises, after the step of etching the metal compound film, a step of forming a plasma from a second processing gas containing a boron- and halogen-containing gas and a hydrogen-containing gas to clean the interior of the plasma processing chamber. When a metal oxide adheres to the inner wall of the plasma chamber after the etching process, the metal oxide can be removed by exposing it to plasma formed from the processing gas and vaporizing it.

In another exemplary embodiment, the second processing gas is the same as the first processing gas.

In another exemplary embodiment, the substrate processing method further comprises, after the step of etching the metal compound film, a step of forming a plasma from a third processing gas including a boron- and halogen-containing gas and a hydrogen-containing gas to remove residue of the metal compound film on the substrate.

In another exemplary embodiment, the third processing gas is the same as the first processing gas.

In another exemplary embodiment, the mask is an organic film or a silicon-containing film.

In another exemplary embodiment, the substrate has an underlying film underneath the metal compound film, and the substrate processing method further comprises, after the step of etching the metal compound film, a step of etching the underlying film.

In another exemplary embodiment, the underlying film is a Si-containing dielectric film.

In another exemplary embodiment, the underlying film is a silicon oxide film, a silicon nitride film, or a film stack including a silicon oxide film and a silicon nitride film.

In another exemplary embodiment, a substrate processing apparatus is provided. The substrate processing apparatus is provided with a plasma processing chamber, a gas supply for supplying a processing gas to the plasma processing chamber, a power source for supplying electric power for forming a plasma in the plasma processing chamber, and a controller configured to cause: placing a substrate including a metal compound film and a mask defining an opening on the metal compound film in the plasma processing chamber, supplying a first processing gas including a boron- and halogen-containing gas and a hydrogen-containing gas to the plasma processing chamber via the gas supply, and forming a plasma in the plasma processing chamber by supplying power from the power source and etching the metal compound film.

This embodiment can selectively etch the metal compound film while suppressing damage to organic film by using a processing gas that includes a hydrogen-containing gas in addition to boron- and halogen-containing gas. In other words, the metal compound film can be etched with a higher degree of selectivity than organic film.

Exemplary embodiments will now be described with reference to the drawings. Elements that are identical or similar are denoted by the same reference numbers in the drawings, and redundant descriptions of these elements have been omitted. Unless otherwise indicated, the positional relationships in the following description, such as up, down, left, and right, are based on the positional relationships depicted in the drawings. The dimensional ratios in the drawings do not indicate actual ratios, and the actual ratios are not limited to those shown in the drawings.

Embodiments

FIG. 1 is a flowchart showing the substrate processing method in an exemplary embodiment ("the processing method" below). In the processing method, a metal compound film is selectively etched relative to an organic film. The processing method comprises: a step (ST1) of providing a substrate including a metal compound film and a mask defining an opening on the metal compound film to a plasma processing chamber; and a step (ST2) of etching the metal compound film by forming a plasma from a first processing gas including a boron- and halogen-containing gas and a hydrogen-containing gas.

Figure 2A:
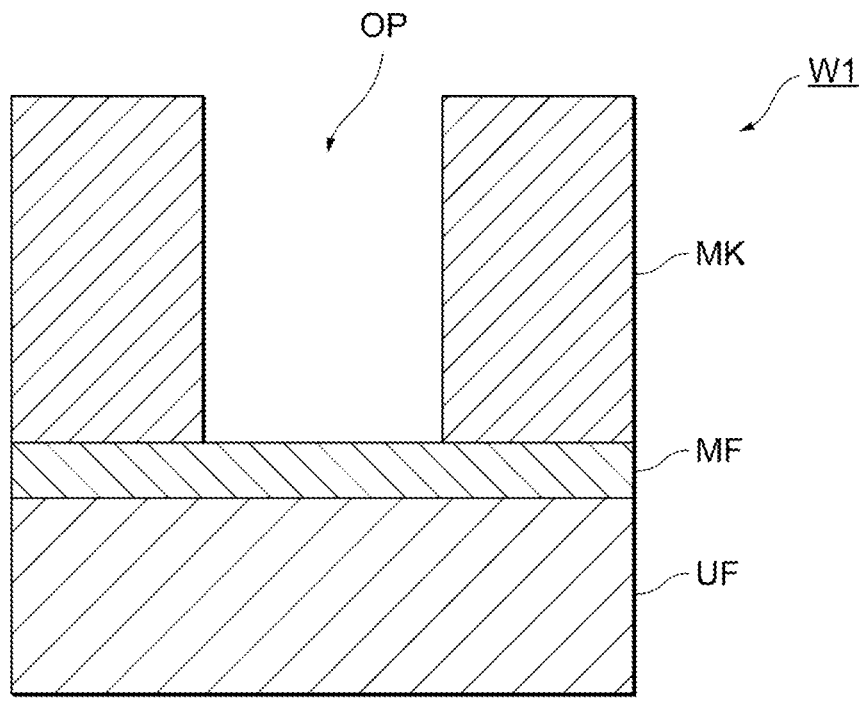
FIGS. 2a-2b are a schematic diagrams showing an example of a substrate subjected to this substrate processing method.
Figure 2B:
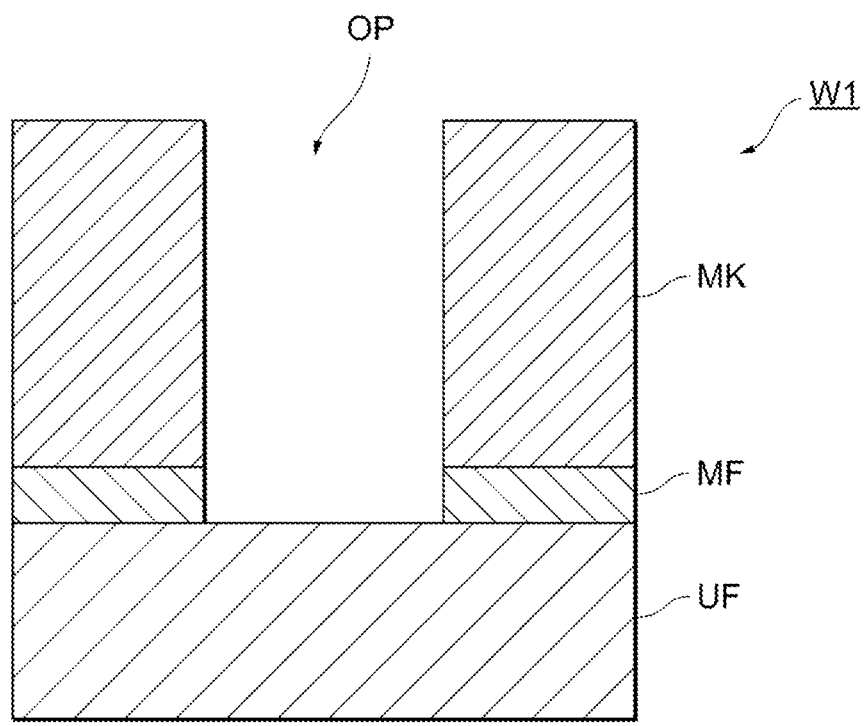

FIG. 2 is a schematic diagram showing an example of a substrate subjected to the substrate processing method. FIG. 2 (A) shows an enlarged portion of the substrate W1 before etching. FIG. 2 (B) shows an enlarged portion of the substrate W1 after etching.

As shown in FIG. 2 (A), the substrate W1 includes a metal compound film MF and a mask MK that defines an opening on the metal compound film MF.

The metal compound film MF may be formed from an oxide, nitride, silicate, or oxynitride of Zr, Hf, Ta, Ti, Al, Y, La, W, Mo, Ni, Ru, or Co. Examples of metal oxides include $ZrO_2$, $HfO_2$, $Ta_2O_5$, $TiO_2$, $Al_2O_3$, $Y_2O_3$, $La_3O_5$, $WO_3$, $MoO_3$, $NiO$, $RuO_2$, and $CoO$. The metal compound film MF may be a high-κ film.

The metal compound film MF is stacked on an underlying film UF. As shown in FIG. 2 (A), the metal compound film MF covers the upper surface of the underlying film UF before etching. As shown in FIG. 2 (B), some of the underlying film UF is exposed after etching. The metal compound film MF has a flat surface in the left-right direction (planar direction) of the substrate W1. The metal compound film MF may have, for example, a surface with irregularities in the vertical direction (thickness direction) of the substrate W1. The metal compound film MF may also have, for example, a stack structure in which layers of two or more metal compounds are stacked on top of each other.

The underlying film UF can be, for example, a dielectric film containing silicon (Si). The underlying film UF may be, for example, a silicon oxide film or a silicon nitride film. The underlying film UF may have a single-layer structure made of a single material, or may have a stack structure in which a plurality of materials (for example, a silicon oxide film and a silicon nitride film) are stacked in alternating fashion. The underlying film UF may have a flat surface in the left-right direction of the substrate W1 or a surface with irregularities in the vertical direction of the substrate W1.

A mask MK is formed on the metal compound film MF. The mask MK defines an opening OP on the metal compound film MF. The opening OP is a space (recess) formed in the vertical direction of the substrate and surrounded by the side walls of the mask MK. The opening OP may have the profile of a circle, an ellipse, or a rectangle, or some other profile such as a linear profile when viewed from above. A portion of the metal compound film MF is exposed at the bottom of the opening OP.

Note that substrate W1 may have another film between the underlying film UF and the metal compound film MF and/or between the metal compound film MF and the mask MK. In other words, on the substrate W1, the metal compound film MF may be formed above the underlying film UF. Also, on the substrate W1, an organic film OF may be formed above the metal compound film MF.

The mask MK is formed from an organic film or a silicon-containing film. When the mask MK is an organic film, the organic film may be, for example, a photoresist or amorphous carbon. The organic film may be, for example, a spin-on coating (SOC) film formed by applying one or more organic materials on top of the metal compound film MF using the spin-on coating method. When the mask MK is a silicon-containing film, the silicon-containing film may be a silicon oxide film or a silicon nitride film.

Figure 3A:
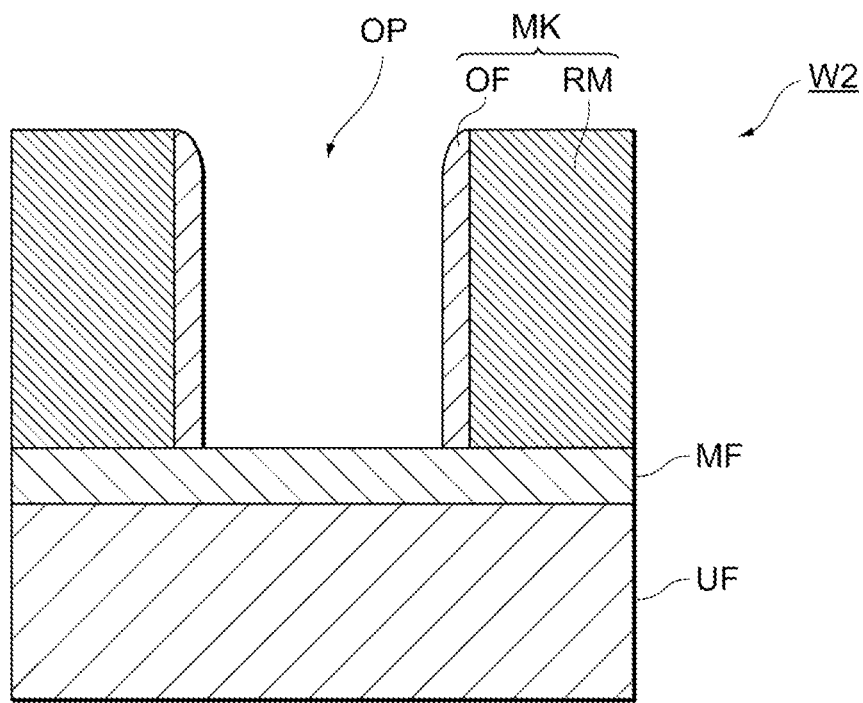
FIGS. 3a-3b is a pair of schematic diagrams showing additional examples of substrates subjected to this substrate processing method.
Figure 3B:
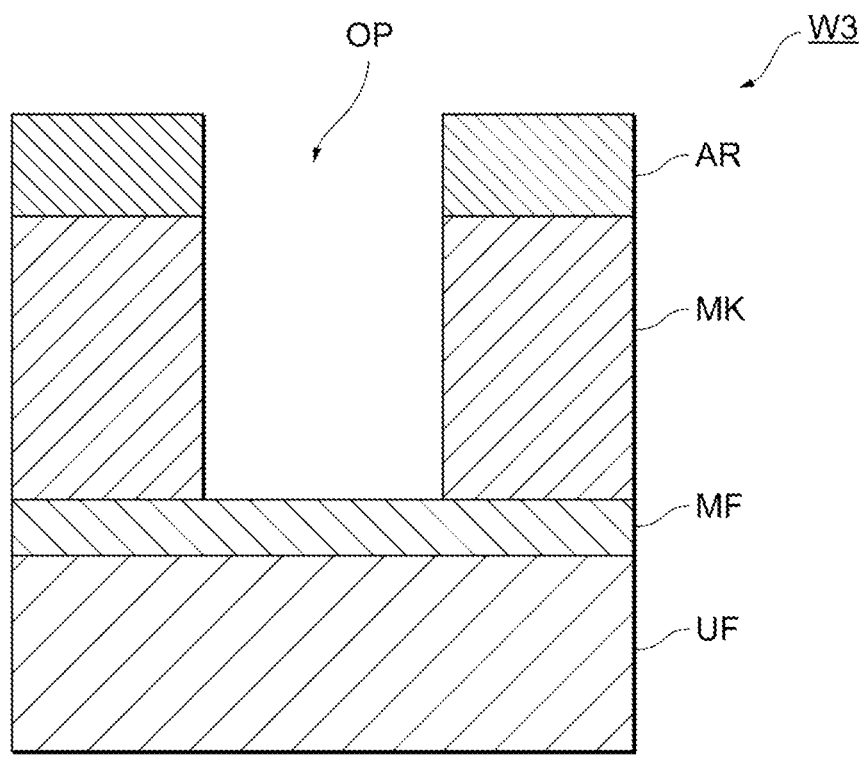

FIG. 3 (A) is a schematic diagram showing another example of a substrate W2 subjected to the substrate processing method. FIG. 3 (B) is a schematic diagram showing another example of a substrate W3 subjected to the substrate processing method.

In the substrate W2 shown in FIG. 3 (A), the mask MK is composed of a resist mask RM in which a pattern has been formed and an organic film OF is formed so as to cover the side wall surfaces of the resist mask RM. In the substrate W3 shown in FIG. 3 (B), an antireflection film AR is formed so as to cover at least the upper surface of the mask MK. The antireflection film AR may be, for example, a Si-containing film. In both substrate W2 and substrate W3, a portion of the metal compound film MF is exposed at the bottom of the opening OP.

Figure 4:
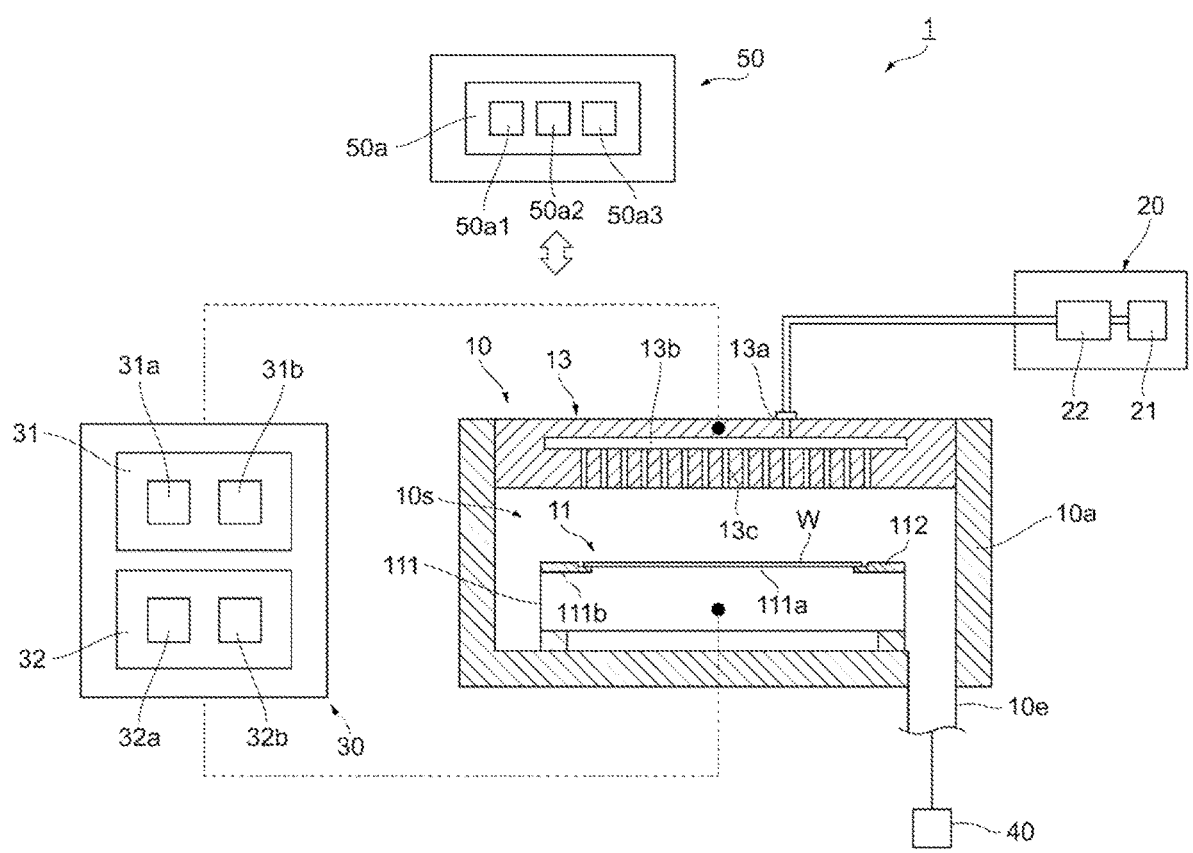
FIG. 4 is a schematic diagram showing an example of a substrate processing apparatus used to perform this substrate processing method.
Figure 5A:
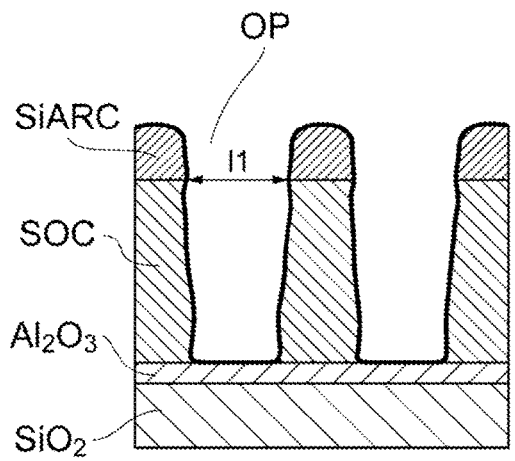
FIGS. 5a-5d show a substrate subjected to the processing method in the first example.
Figure 5B:
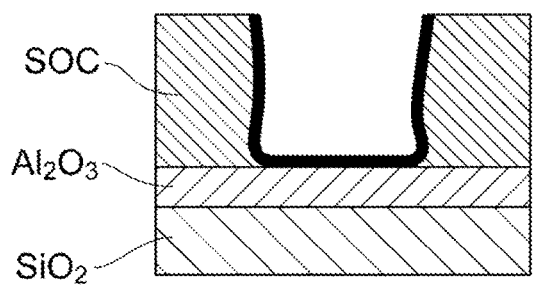
Figure 5C:
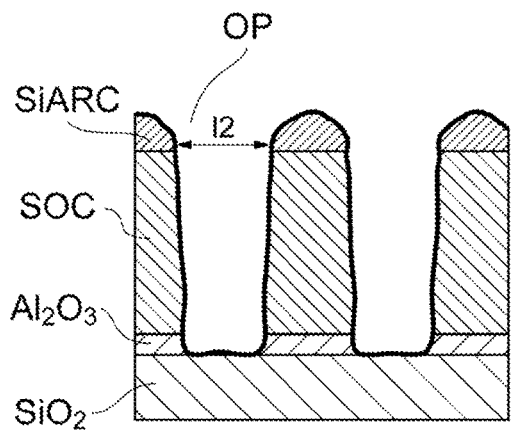
Figure 5D:
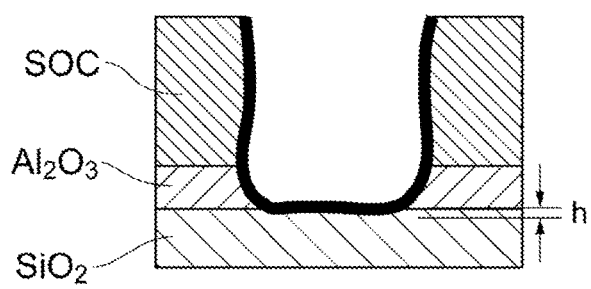

FIG. 4 is a schematic diagram showing an example of a substrate processing apparatus used to perform this substrate processing method. An example of the substrate processing apparatus 1 will now be described with reference to FIG. 4. In the following description, the substrate (wafer) subjected to the processing method is referred to as substrate W (including, but not limited to, substrates W1, W2 and W3).

The substrate processing apparatus 1 is a capacitively coupled plasma processing apparatus. The substrate processing apparatus 1 includes a plasma processing chamber 10, a gas supply 20, a power supply 30, an exhaust system 40, and a controller 50. The substrate processing apparatus 1 also includes a substrate support 11 and a gas introducing unit. The gas introducing unit is configured to introduce at least one processing gas into the plasma processing chamber 10.

The gas introducing unit includes a shower head 13. The substrate support 11 is arranged in the plasma processing chamber 10. The shower head 13 is arranged above the substrate support 11. In one exemplary embodiment, the shower head 13 constitutes a portion of the ceiling of the plasma processing chamber 10. The plasma processing chamber 10 includes a plasma processing space 10s defined by the shower head 13, the side walls 10a of the plasma processing chamber 10, and the substrate support 11. The plasma processing chamber 10 has at least one gas supply port for supplying at least one processing gas to the plasma processing space 10s, and at least one gas discharge port for discharging gas from the plasma processing space. The side walls 10a are grounded. The shower head 13 and the substrate support 11 are electrically insulated from the plasma processing chamber 10 frame.

The substrate support 11 includes a main body 111 and a ring assembly 112. The main body 111 has a central region (substrate supporting surface) 111a for supporting the substrate (wafer) W and an annular region (ring supporting surface) 111b for supporting the ring assembly 112. When viewed from above, the annular region 111b of the main body 111 surrounds the central region 111a of the main body 111. The substrate W is placed on the central region 111a of the main body 111, and the ring assembly 112 is arranged on the annular region 111b of the main body 111 so that it surrounds the substrate W on the central region 111a of the main body 111. In one exemplary embodiment, the main body 111 includes a platform and an electrostatic chuck. The platform includes a conductive member. The conductive member in the platform functions as the lower electrode. The electrostatic chuck is arranged on the platform. The upper surface of the electrostatic chuck has a substrate supporting surface 111a. The ring assembly 112 includes one or more annular members. At least one of the one or more annular members is an edge ring. While not depicted in the figure, the substrate support 11 may include a temperature control module configured to adjust at least one of the electrostatic chuck, the ring assembly 112, and the substrate to a target temperature. The temperature control module may include a heater, a heat transfer medium, a conduit, or a combination thereof. A heat transfer fluid such as brine or a gas flows through the conduit. The substrate support 11 may also include a heat transfer gas supply to supply a heat transfer gas between the back surface of the substrate W and the substrate supporting surface 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced to the plasma processing space 10s from the plurality of gas introduction ports 13c. The shower head 13 also includes a conductive member. The conductive member in the shower head 13 functions as the upper electrode. In addition to the shower head 13, the gas introducing unit may include one or more side gas injectors (SGIs) attached to one or more openings formed in the side walls 10a.

The gas supply 20 may include at least one gas source 21 and at least one flow rate controller 22. In one exemplary embodiment, the gas supply 20 is configured to supply at least one processing gas from the corresponding gas source 21 to the shower head 13 via the corresponding flow rate controller 22. Each flow rate controller 22 may include, for example, a mass flow controller or a pressure controlled flow rate controller. The gas supply 20 may include one or more flow rate modulating devices that modulate or pulse the flow rate of at least one processing gas.

The power supply 30 includes an RF power supply 31 connected to the plasma processing chamber 10 via at least one impedance matching circuit. The RF power supply 31 is configured to supply at least one RF signal (RF power), such as a source RF signal or a bias RF signal, to the conductive member in the substrate support 11 and/or the conductive member in the shower head 13. As a result, plasma is formed from at least one processing gas supplied to the plasma processing space 10s. Thus, the RF power source 31 may function as at least part of a plasma generator configured to form a plasma from one or more processing gases in the plasma processing chamber 10. By applying a bias RF signal to the conductive member in the substrate support 11, a bias potential can be generated in the substrate W and the ion portion of the plasma drawn toward the substrate W.

In one exemplary embodiment, the RF power supply 31 includes a first RF generator 31a and a second RF generator 31b. The first RF generator 31a is connected to the conductive member in the substrate support 11 and/or the conductive member in the shower head 13 via at least one impedance matching circuit to generate a source RF signal (source RF power) for forming a plasma. In one exemplary embodiment, the source RF signal has a frequency in the range of 13 MHz to 150 MHz. In one exemplary embodiment, the first RF generator 31a may be configured to generate a plurality of source RF signals with different frequencies. The one or more source RF signals are supplied to the conductive member in the substrate support 11 and/or the conductive member in the shower head 13. The second RF generator 31b is connected to the conductive member in the substrate support 11 via at least one impedance matching circuit and is configured to generate a bias RF signal (bias RF power). In one exemplary embodiment, the bias RF signal has a lower frequency than the source RF signal. In another exemplary embodiment, the bias RF signal has a frequency in the range of 400 kHz to 13.56 MHz. In another exemplary embodiment, the second RF generator 31b may be configured to generate a plurality of bias RF signals with different frequencies. The generated bias RF signal is supplied to the conductive member in the substrate support 11. In various embodiments, at least one of the source RF signals and the bias RF signals may be pulsed.

The power supply 30 may include a DC power supply 32 connected to the plasma processing chamber 10. The DC power supply 32 may be a first DC generator 32a and a second DC generator 32b. In one exemplary embodiment, the first DC generator 32a is connected to the conductive member in the substrate support 11 and is configured to generate a first DC signal. The generated first bias DC signal is applied to the conductive member in the substrate support 11. In one exemplary embodiment, the first DC signal may be applied to another electrode, such as an electrode in the electrostatic chuck. In one exemplary embodiment, the second DC generator 32b is connected to the conductive member in the shower head 13 and is configured to generate a second DC signal. The generated second DC signal is applied to the conductive member in the shower head 13. In various embodiments, at least one of the first and second DC signals may be pulsed. Note that the first generator 32a and second DC generator 32b may be provided in addition to the RF power supply 31, or the first DC generator 32a may be provided instead of the second RF generator 31b.

The exhaust system 40 may be connected, for example, to a gas outlet 10e provided at the bottom of the plasma processing chamber 10. The exhaust system 40 may include a pressure regulating valve and a vacuum pump. The pressure control valve regulates the pressure in the plasma processing space 10s. The vacuum pump may be a turbo molecular pump, a dry pump, or a combination thereof.

The controller 50 processes computer-executable instructions that cause the substrate processing apparatus 1 to perform the various steps described in the present disclosure. The controller 50 may be configured to control each element in the substrate processing apparatus 1 to perform the various steps described in the present disclosure. In one exemplary embodiment, some or all of the controller 50 may be provided as part of the configuration of a apparatus external to the substrate processing apparatus 1. The controller 50 may include, for example, a computer 50a. The computer 50a may include, for example, a central processor (CPU: Central Processing Unit) 2a1, a storage unit 50a2, and a communication interface 50a3. The processor 50a1 may be configured to perform various control operations based on a program stored in the storage unit 50a2. The storage unit 50a2 may include random access memory (RAM), read-only memory (ROM), a hard disk drive (HDD), a solid-state drive (SSD), or any combination thereof. The communication interface 50a3 may communicate with other configurations of the substrate processing apparatus 1 via a communication line such as a local area network (LAN).

Returning to FIG. 1, the description continues. In the following description, the controller 50 controls each unit of the substrate processing apparatus 1 (see FIG. 4) to execute the processing method.

Substrate Providing Step: ST1

First, in the substrate providing step (ST1), a substrate W is provided to the plasma processing space 10s. The substrate W is placed on the substrate supporting surface 111a of the substrate support 11 in the plasma processing space 10s and held by the electrostatic chuck. At least some of the processing executed to form each configuration on the substrate W may be performed in the plasma processing space 10s. Also, the substrate W may be supplied to the plasma processing space 10s after some or all of each configuration on the substrate W has been formed by a apparatus or chamber outside of the substrate processing apparatus 1.

Etching Step: ST2

The etching step (ST2) includes a gas supplying step (ST21) in which a processing gas is supplied to the plasma processing space 10s in the plasma processing chamber 10 and a plasma forming step (ST22) in which plasma is formed by the processing gas. The gas supplying step (ST21) and the plasma forming step (ST22) are executed in successive order with a substrate W placed on the substrate support 11 (and with the substrate W placed in the plasma processing space 10s).

In the gas supplying step (ST21), the processing gas is supplied from the gas supply 20 into the plasma processing space 10s as a shower via the shower head 13. The processing gas includes a boron- and halogen-containing gas and a hydrogen-containing gas. The processing gas may also include a diluting gas such as Ar gas. Each gas constituting the processing gas is supplied from a separate gas source 21 in the gas supply 20, and the flow rate is adjusted by the flow rate controller 22 corresponding to each gas source. Once the flow rate of each gas has been adjusted, the gases are mixed with each other and supplied to the plasma processing space 10s via the shower head 13. The pressure in the plasma processing space 10s is adjusted by controlling the pressure control valve in the exhaust system 40.

Among the processing gases, the boron-and halogen-containing gas may be, for example, a single gas containing both boron and halogen. This single gas may be, for example, $BCl_3$ gas. The boron- and halogen-containing gas may also be, for example, a mixed gas by combining one or more gases containing boron with one or more gases containing a halogen. The mixed gas may be, for example, a mixed gas of $BH_3$ gas and $Cl_2$ gas, or a mixed gas of $BCl_3$ gas, $BH_3$ gas and $Cl_2$ gas. The mixed gas may contain a $B(CH_3)_3$ gas or $(CH_3CH_2)_3B$ gas. Each gas in the mixed gas may be supplied from a separate gas source 21. These gases are mixed together to obtain a mixed gas that is supplied to the plasma processing space 10s from the shower head 13. The mixed gas may also be supplied from a single gas source 21 in which the gases have already been mixed together.

The hydrogen-containing gas may include, for example, hydrogen gas ($H_2$), a hydrocarbon gas (CH), or a hydrofluorocarbon gas (HFC). The hydrofluorocarbon gas in the processing method contains hydrogen atoms and atoms of a halogen other than fluorine, such as chlorine, which replace some of the fluorine atoms. The hydrogen-containing gas may be a single gas, for example, hydrogen gas. The hydrogen-containing gas may be a mixed gas in which two or more gases, such as hydrogen gas and a hydrocarbon gas, have been mixed together. Each gas in the mixed gas may be supplied from a separate gas source 21. These gases are mixed together to obtain a mixed gas that is supplied to the plasma processing space 10s from the shower head 13. The mixed gas may also be supplied from a single gas source 21 in which the gases have already been mixed together.

The ratio of the volume of the hydrogen gas-containing gas to the total volume of the boron- and halogen-containing gas and the hydrogen-containing gas (hydrogen-containing gas/(boron- and halogen-containing gas+hydrogen-containing gas)) may be 10 to 30%.

In the plasma forming step (ST22), the source RF signal (source RF power) generated by the first RF generator 31a is applied to the upper electrode (the conductive member in the shower head 13) and/or the lower electrode (the conductive member in the platform of the substrate support 11). The bias RF signal (bias RF power) generated by the second RF generator 31b is applied to the lower electrode (the conductive member in the platform of the substrate support 11). The processing gas is then excited in the plasma processing space 10s to form a plasma. The active species such as the ions or radicals in the formed plasma are drawn to the substrate W, and the metal compound film MF on the substrate W is etched to form recesses. This removes the portion of the metal compound film MF at the bottom of the opening OP to expose the underlying film UF in the opening OP (see, for example, FIG. 2 (B)).

After the etching step (ST2), the interior of the plasma processing space 10s is purged, and the reaction products are discharged from the gas discharge port 10e. After the etching step (ST2), plasma may be formed from the processing gas to etch the underlying film MF further. At this time, the metal compound film MF may serve as the mask. The appropriate processing gas may be selected for etching based on the material used in the underlying film MF, etc. As a result, a recess with a shape corresponding to that of the opening OP is formed in the underlying film MF.

The processing method can remove the metal compound film MF while suppressing damage to the mask MK by using a processing gas containing a hydrogen-containing gas in addition to a boron- and halogen-containing gas. In other words, the metal compound film MF can be etched with a higher degree of selectivity than the mask MK.

The processing gas in the processing method can also etch the metal compound film with a higher degree of selectivity than the Si-containing dielectric film. This can keep the underlying film UF (Si-containing dielectric film) from being removed along with the metal compound film MF in the etching process.

After the etching step (ST2), some of the metal compound film MF may not have been completely removed and remains behind. In this case, the step of forming a plasma from the processing gas in the processing method may be performed again to remove the residual metal compound film MF. The processing gas may include a boron- and halogen-containing gas and a hydrogen-containing gas, and may be the same as or different from the processing gas used in the previous etching step. The processing gas may also include a diluting gas such as Ar gas. As mentioned above, the processing gas of the processing method can etch the metal compound film MF with a higher degree of selectivity than Si-containing dielectric film. As a result, the residue generated by etching the metal compound film MF can be selectively removed from the underlying film UF when the underlying film UF is exposed in the opening OP.

A cleaning step for cleaning the plasma processing chamber 10 may also be provided after the etching step (ST2). When the processing method has been performed many times, reaction products with the etched materials (such as Hf, Al, etc.) are deposited in the plasma processing chamber 10 (for example, on the side walls 10a and the substrate support 11). The cleaning step for removing these deposits can be performed, for example, as follows. First, the substrate W is removed from the plasma processing chamber 10. Next, a processing gas containing a boron- and halogen-containing gas and a hydrogen-containing gas is supplied to the plasma processing chamber 10 to form a plasma, and the deposits in the plasma processing chamber 10 are vaporized (for example, Hf and Al are vaporized in the form of $HfCl_4$ and $AlCl_4$ when processing gas contains $BCl_3$ gas). The vaporized deposits are then discharged from the gas discharge port 10e by purging the plasma processing space 10s. This makes it possible to remove deposits adhering to the plasma processing chamber 10. The processing gas may include a boron- and halogen-containing gas and a hydrogen-containing gas, and may be the same as or different from the processing gas used in the etching step. The processing gas may also include a diluting gas such as Ar gas.

First Example: $Al_2O_3$

FIG. 5 shows a substrate subjected to the processing method in the first example. The first embodiment will now be described with reference to FIG. 5. In the first embodiment, the processing method was applied to a substrate W4 having a metal compound film consisting of $Al_2O_3$. FIG. 5 (A) is a diagram schematically showing a cross section of the substrate W4 before etching, and FIG. 5 (B) is an enlarged view of the same cross section near the metal compound film ($Al_2O_3$). FIG. 5 (C) is a diagram schematically showing a cross section of the substrate W4 after etching, and FIG. 5 (D) is an enlarged view of the same cross section near the metal compound film ($Al_2O_3$).

As shown in FIG. 5, the substrate W4 in the first embodiment is provided with a $SiO_2$ film (underlying film UF), an $Al_2O_3$ film (metal compound film MF) formed on top of the $SiO_2$ film, a SOC film (organic film OF) defining an opening on the $Al_2O_3$ film, and a Si-containing reflective film (SiARC) formed on top of the SOC film.

The processing method was performed on the substrate W4 using plasma formed from a mixed gas of $BCl_3$ gas, $H_2$ gas, and Ar gas. At this time, the ratio of the flow rate of the $H_2$ gas to the total flow rate of the $BCl_3$ gas and the $H_2$ gas was 15 vol %. The bias RF power supplied to the lower electrode was 25 W (processing conditions P1).

As a result, the exposed portion of the $Al_2O_3$ film (metal compound film MF) was removed as shown in FIG. 5 (B). In addition, almost no damage (removal) to the $SiO_2$ film (underlying film UF) or the SOC film (organic film OF) was observed. The width l1 of the opening OP before etching of the $Al_2O_3$ film was 59.5 nm, and the width l2 of the opening OP after etching was 55.7 nm. Specifically, after etching the $Al_2O_3$ film, the depression h (the amount of $SiO_2$ film etching) in the exposed portion of the $SiO_2$ film was held to 1 nm or less. In other words, in the first embodiment, the $Al_2O_3$ film (metal compound film MF) could be etched with a higher degree of selectivity than the $SiO_2$ film (underlayer film UF) and the SOC film (organic film OF).

Next, proper conditions for processing the substrate W4 in the processing method were studied in Test 1 to Test 3 below.

Test 1: Bias RF Power

Figure 6A:
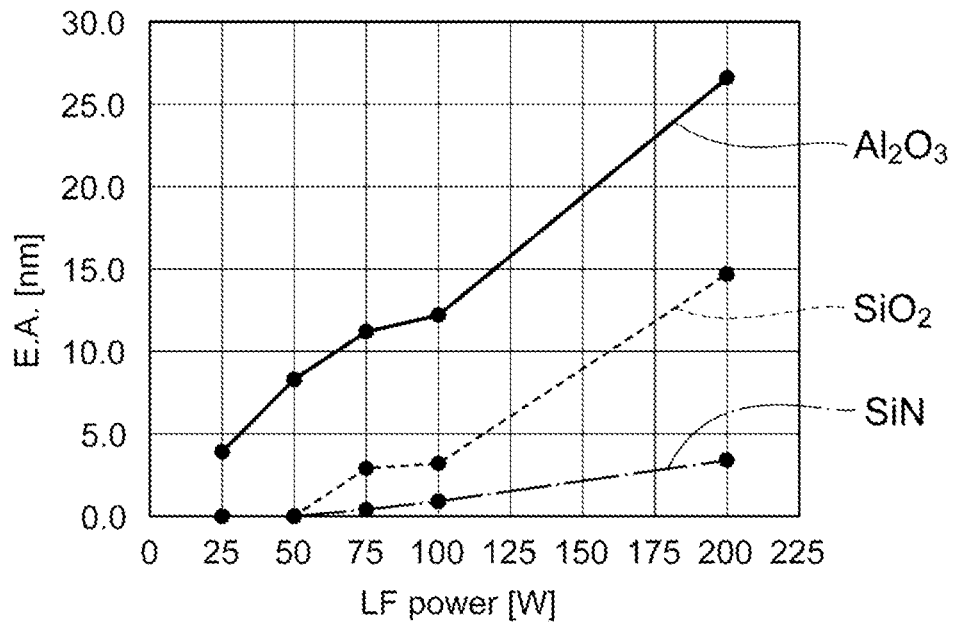
FIGS. 6a-6b are diagrams showing the results of Test 1 performed on the first example.
Figure 6B:
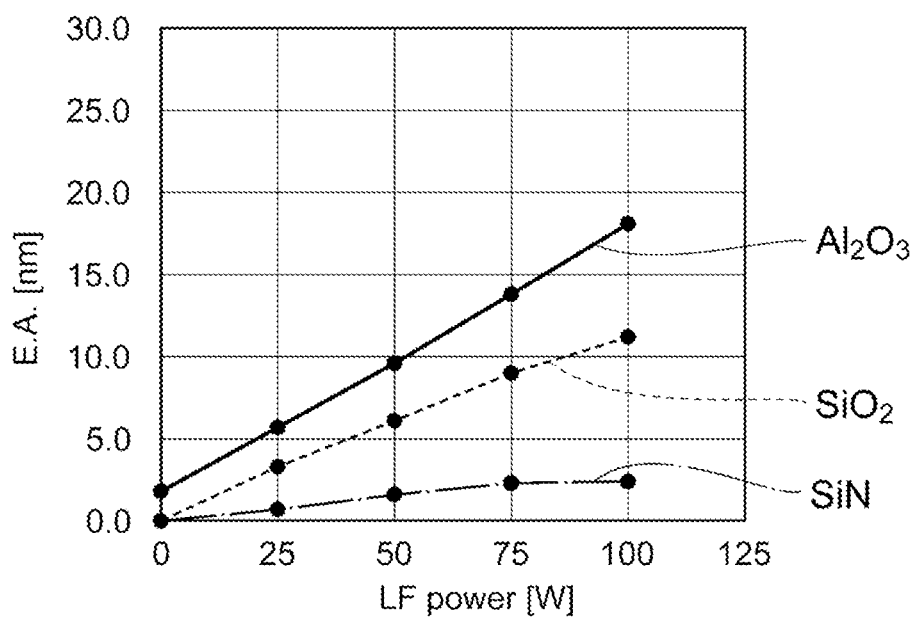

FIG. 6 is a diagram showing the results of Test 1 performed on the first embodiment. Test 1 was a test performed to determine the appropriate range for the bias RF power. Specifically, blanket films of $Al_2O_3$, $SiO_2$, and SiN were prepared, the bias RF power [W] was changed in the range from 25 to 200 W, and the etched amounts (E.A.) [nm] of $Al_2O_3$, $SiO_2$, and SiN were measured. The processing conditions at this time were the same as the processing conditions P1 except for the bias power (processing conditions P2). The results of this test are shown in FIG. 6 (A).

In a reference example for comparison with processing conditions P2, the test was conducted under almost the same conditions as processing conditions P1 except that the processing gas did not contain hydrogen gas (processing conditions P3). The results of this test are shown in FIG. 6 (B).

As shown in FIG. 6 (A), when the bias RF power was 25 to 50 W under processing conditions P2, the $Al_2O_3$ was etched, while the $SiO_2$ and SiN were hardly etched at all. Specifically when the processing gas in the processing method is used, the etching selectivity of $Al_2O_3$ can be increased relative to $SiO_2$ and SiN by setting the value for the bias RF power in a relatively low range. In the case of processing conditions 2, when the bias RF power is in the range of 25 to 50 W, the average energy of the ions incident on the blanket film of $Al_2O_3$ is about 50 to 100 eV.

In contrast, as shown in FIG. 6 (B), in the case of processing conditions P3 (where the processing gas does not contain hydrogen gas), while the bias RF power is in a range (about 0 to 10 W) in which $Al_2O_3$ is selectively etched relative to $SiO_2$ and SiN, the $Al_2O_3$ etching rate is low. In other words, when the processing gas in the processing method is not used, it is difficult to increase the etching selectivity for $Al_2O_3$ relative to $SiO_2$ and SiN while keeping the etching rate for $Al_2O_3$ in a high range.

Test 2: Volume Ratio of Hydrogen-Containing Gas

Figure 7:
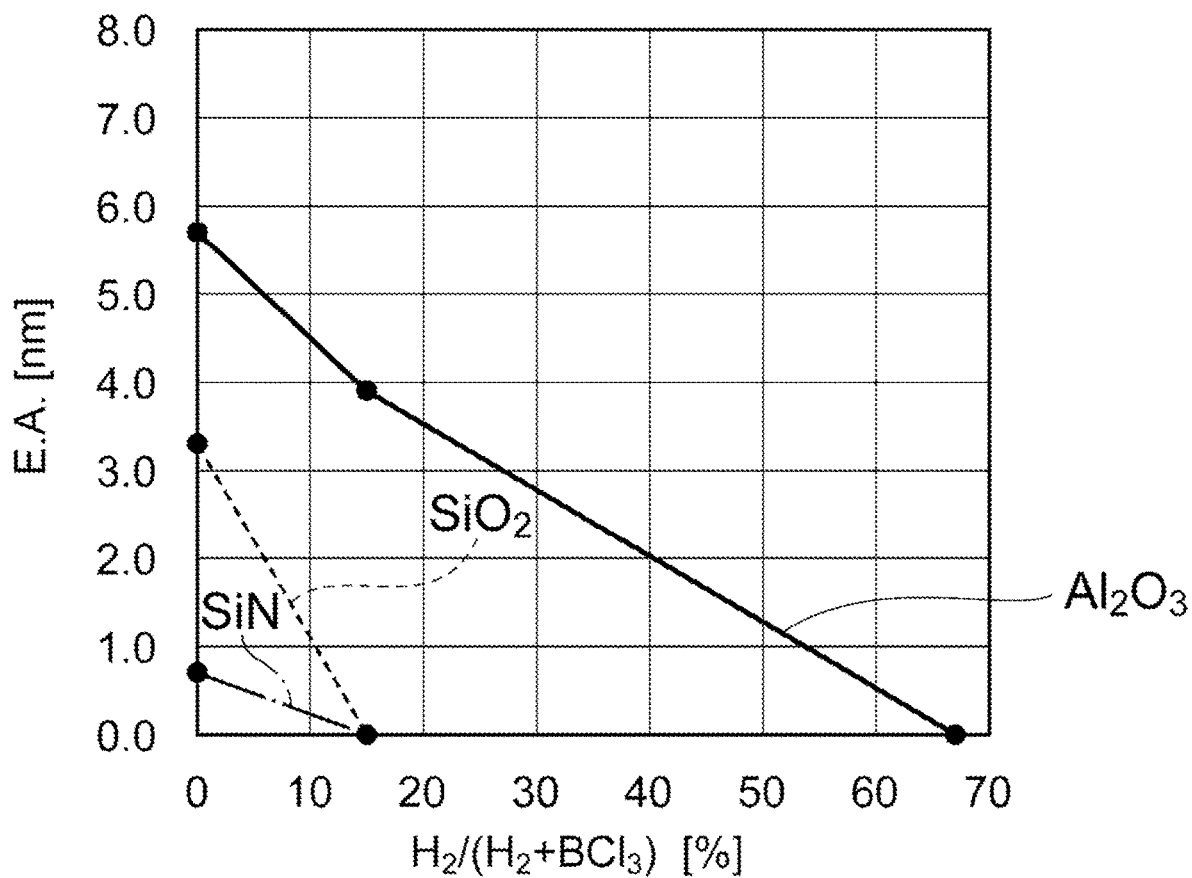
FIG. 7 is a diagram showing the results of Test 2 performed on the first example.
Figure 8A:
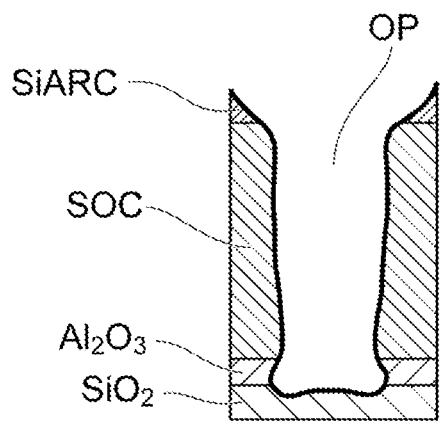
FIGS. 8a-8f are diagrams showing the results of Test 3 performed on the first example.
Figure 8B:
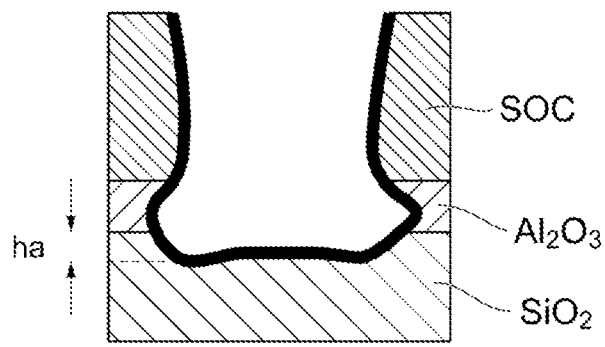
Figure 8C:
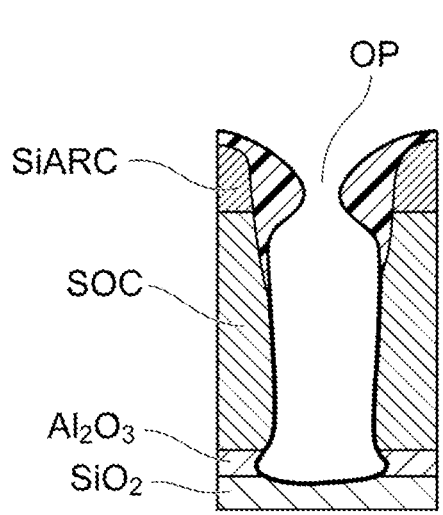
Figure 8D:
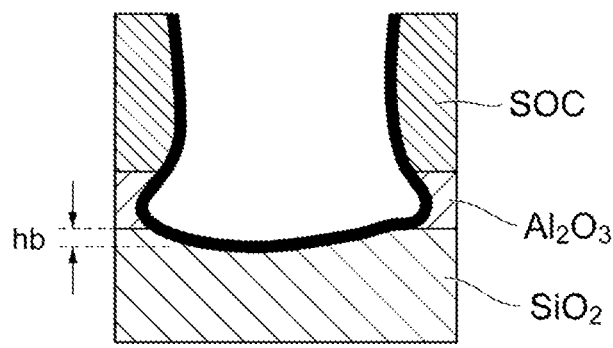
Figure 8E:
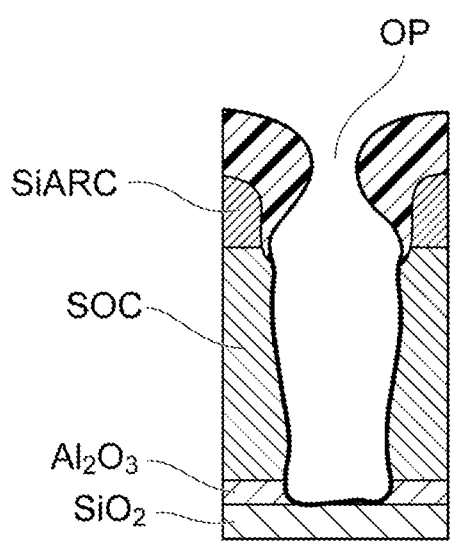
Figure 8F:
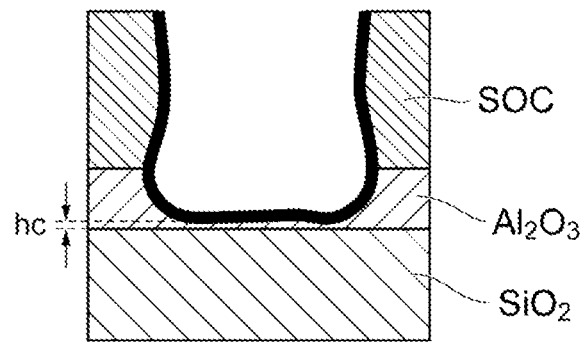

FIG. 7 is a diagram showing the results of Test 2 performed on the first embodiment. Test 2 was a test performed to determine the appropriate range for the volume ratio of the hydrogen-containing gas. Specifically, blanket films of $Al_2O_3$, $SiO_2$, and SiN were prepared, the ratio of the flow rate of the $H_2$ gas to the total flow rate of the $BCl_3$ gas and $H_2$ gas was changed in the range of 0 to 67 vol %, and the etched amounts (E.A.) [nm] of $Al_2O_3$, $SiO_2$, and SiN were measured. The processing conditions at this time were the same as the processing conditions P1 except for the ratio of the flow rate of the $H_2$ gas to the total flow rate of the $BCl_3$ gas and the $H_2$ gas (processing conditions P4). The results of this test are shown in FIG. 7.

As shown in FIG. 7, when the ratio of hydrogen gas is about 10 to 15% under processing conditions P4, $Al_2O_3$ is selectively etched relative to $SiO_2$ and SiN. Specifically, when the processing gas in the processing method is used, the etching selectivity for $Al_2O_3$ relative to $SiO_2$ and SiN can be increased further by setting the volume ratio for the hydrogen gas within a specific range (about 10 to 15% under processing conditions P4).

Test 3: High Selectivity Conditions to Base Film UR

FIG. 8 is a diagram showing the results of Test 3 performed on the first embodiment. Test 3 was a test performed to determine the appropriate processing conditions for increasing etching selectivity for $Al_2O_3$ film (the metal compound film MF) relative to $SiO_2$ film (the underlying film UF) on the substrate W4. Test 3 can be said to be a test performed to determine the processing conditions for increasing the over etch resistance of the $SiO_2$ film (the underlying film UF).

First, the test was performed on the substrate W4 under the same conditions as in processing conditions P1 except that the etching time was twice that of processing conditions P1 (processing conditions P5). Specifically, processing conditions P5 cause over etching over the same time period as the main etching after etching under processing conditions P1 (main etching) had been performed.

The results are shown in FIG. 8 (A) and FIG. 8 (B). FIG. 8 (A) is a diagram schematically showing a cross section of the substrate W4 after etching under processing conditions P5, and FIG. 8 (B) is an enlarged view of the same cross section near the metal compound film ($Al_2O_3$). As shown in FIG. 8 (B), after etching under processing conditions P5, the depression ha (the amount of etching) in the exposed portion of the $SiO_2$ film was a relatively significant 6.5 nm.

Next, the test was performed on the substrate W4 under the same conditions as in processing conditions P1 except that the etching time was twice that of processing conditions P1 and the ratio of the flow rate of the $H_2$ gas to the total flow rate of the $BCl_3$ gas and the $H_2$ gas was set to 30 vol % (processing conditions P6). Specifically, processing conditions P6 increased the volume ratio of hydrogen gas relative to processing conditions P5 and caused over etching over the same time period as the main etching after main etching under processing conditions P5 had been performed.

The results are shown in FIG. 8 (C) and FIG. 8 (D). FIG. 8 (C) is a diagram schematically showing a cross section of the substrate W4 after etching under processing conditions P6, and FIG. 8 (D) is an enlarged view of the same cross section near the metal compound film ($Al_2O_3$). As shown in FIG. 8 (D), after etching under processing conditions P6, the depression hb (the amount of etching) in the exposed portion of the $SiO_2$ film was reduced somewhat to 4.9 nm.

Next, the test was performed on the substrate W4 under the same conditions as in processing conditions P1 except that the etching time was more than four times that of processing conditions P1, the ratio of the flow rate of the $H_2$ gas to the total flow rate of the $BCl_3$ gas and the $H_2$ gas was set to 30 vol %, and the source RF power was less than half of that under processing conditions P1 (processing conditions P7).

The results are shown in FIG. 8 (E) and FIG. 8 (F). FIG. 8 (E) is a diagram schematically showing a cross section of the substrate W4 after etching under processing conditions P7, and FIG. 8 (F) is an enlarged view of the same cross section near the metal compound film ($Al_2O_3$). As shown in FIG. 8 (F), after etching under processing conditions P7, the depression he (the amount of etching) in the exposed portion of the $SiO_2$ film was insignificant, less than 1 nm.

As mentioned above, in the processing method, the etching selectivity for $Al_2O_3$ film (the metal compound film MF) relative to $SiO_2$ film (the underlying film UF) can be increased further (that is, the over etching resistance of the underlying film UF can be increased further) by increasing the volume ratio of the hydrogen gas and reducing the source RF power.

Second Example: $HfO_2$

In the second example, the processing method was applied to a substrate W5 with a metal compound film consisting of $HfO_2$. An $HfO_2$ film (the metal compound film MF) is formed on the substrate W5, and then a SOC film (organic film OF) defining the opening OP is stacked on top of the $HfO_2$ film. The processing method was performed on the substrate W5 using plasma formed from a mixed gas of $BCl_3$ gas, $H_2$ gas, and Ar gas. At this time, the ratio of the flow rate of $H_2$ gas to the total flow rate of $BCl_3$ gas and $H_2$ gas was 15 vol %. The bias RF power applied to the lower electrode was 125 W (processing conditions P8).

As a result, the exposed portion of the $HfO_2$ film (the metal compound film MF) was removed. Almost no damage to (removal of) SOC film (organic film OF) was observed at this time. Specifically, the width of the opening OP before etching was 76.0 nm and the width of the opening OP after etching was 76.0 nm. In other words, it remained unchanged.

Next, the ratio of the flow rate of $H_2$ gas to the total flow rate of $BCl_3$ gas and $H_2$ gas was changed to 20, 25 and 30 vol % in processing conditions P8, and the processing method was performed on the substrate W5. In a reference example for comparison with processing conditions P8, the test was conducted under almost the same conditions as processing conditions P8 except that the processing gas did not contain hydrogen gas.

As a result, the exposed portion of $HfO_2$ film (metal compound film MF) was removed under all of the processing conditions. At this time, almost no damage to (removal of) SOC film (organic film OF) was observed in the range where the flow rate of $H_2$ gas to the total flow rate of $BCl_3$ gas and $H_2$ gas was from 20 to 30 vol %. In other words, in the range where the flow rate of $H_2$ gas to the total flow rate of $BCl_3$ gas and $H_2$ gas is from 20 to 30 vol %, the width of the opening OP before etching was 76.0 nm and the width of the opening OP after etching was from 70.0 to 74.0 nm. In other words, it was essentially unchanged. In contrast, in the reference example (where the processing gas did not contain any hydrogen-containing gas), the width of the opening OP before etching was 76.0 nm, the width of the opening OP after etching was 83.5 nm, and damage to (removal of) SOC film (organic film OF) was observed.

In one exemplary embodiment, the metal compound film can be etched appropriately.

Each of the embodiments was provided for purposes of explanation and are not intended to limit the scope of the present disclosure. Each of the above embodiments can be modified in various ways without departing from the scope and spirit of the present disclosure. The processing method can be executed using a substrate processing apparatus other than a capacitive coupled substrate processing apparatus 1, for example, a substrate processing apparatus that uses another plasma source such as inductively coupled plasma or microwave plasma.

The invention claimed is:

1. A substrate processing method comprising steps of:
providing a substrate including a metal compound film and a mask defining an opening on the metal compound film to a plasma processing chamber; and
etching the metal compound film by forming a plasma from a first processing gas including $BCl_3$ gas and $H_2$ gas, a ratio of volume of the $H_2$ gas to a total volume of the $BCl_3$ gas and $H_2$ gas being from 10% to 15%,
wherein the metal compound film is formed from an oxide, nitride, silicate, or oxynitride of Hf, Ta, Ti, Al, Y, La, W, Mo, Ni, Ru, or Co, and
wherein the metal compound film includes $Al_2O_3$ or $HfO_2$.

2. The substrate processing method according to claim 1, wherein the metal compound film is a high-κ film.

3. The substrate processing method according to claim 1, wherein the mask is an organic film or a silicon-containing film.

4. The substrate processing method according to claim 1, wherein the substrate has an underlying film underneath the metal compound film, the underlying film including a silicon nitride film.

5. The substrate processing method according to claim 1, wherein the step of providing a substrate comprises the steps of:
placing the substrate on a substrate support in the plasma processing chamber; and
supplying bias radio-frequency (RF) power to the substrate support so that an average energy of ions incident on the metal compound film is 100 eV or less.

6. The substrate processing method according to claim 5, wherein the average energy of the ions incident on the metal compound film is 50 eV to 100 eV.

7. The substrate processing method according to claim 1, further comprising, after the step of etching the metal compound film, a step of forming a plasma from a second processing gas containing a boron-and halogen-containing gas and a hydrogen-containing gas to clean an interior of the plasma processing chamber.

8. The substrate processing method according to claim 7, wherein the second processing gas is the same as the first processing gas.

9. The substrate processing method according to claim 1, further comprising, after the step of etching the metal compound film, a step of forming a plasma from a third processing gas including a boron-and halogen-containing gas and a hydrogen-containing gas to remove residue of the metal compound film on the substrate.

10. The substrate processing method according to claim 9, wherein the third processing gas is the same as the first processing gas.

11. The substrate processing method according to claim 1, wherein the substrate has an underlying film underneath the metal compound film, and the method further comprises, after the step of etching the metal compound film, a step of etching the underlying film.

12. The substrate processing method according to claim 11, wherein the underlying film is a Si-containing dielectric film.

13. The substrate processing method according to claim 11, wherein the underlying film is a silicon oxide film, a silicon nitride film, or a film stack including a silicon oxide film and a silicon nitride film.

14. A substrate processing method comprising steps of:
providing a substrate including a metal compound film and a mask defining an opening on the metal compound film to a plasma processing chamber;
etching the metal compound film by forming a plasma from a first processing gas including a boron-and halogen-containing gas and a hydrogen-containing gas, wherein the metal compound film is formed from an oxide, nitride, silicate, or oxynitride of Hf, Ta, Ti, Al, Y, La, W, Mo, Ni, Ru, or Co; and
after the step of etching the metal compound film:
a step of purging a plasma processing space to discharge reaction products generated by etching the metal compound film;
a step of forming a plasma from a third processing gas to remove residue in the opening on the metal compound film, the third processing gas including a boron- and halogen-containing gas and a hydrogen-containing gas; and
a step of etching an underlying film exposed in the opening.

15. The substrate processing method according to claim 14, wherein the third processing gas is the same as the first processing gas.

16. The substrate processing method according to claim 14, wherein the mask is an organic film or a silicon-containing film.

17. The substrate processing method according to claim 14, wherein the underlying film is a Si-containing dielectric film.

18. The substrate processing method according to claim 14, wherein the underlying film is a silicon oxide film, a silicon nitride film, or a film stack including a silicon oxide film and a silicon nitride film.

19. The substrate processing method according to claim 14, wherein the metal compound film includes $Al_2O_3$ or $HfO_2$.

20. The substrate processing method according to claim 19, wherein the substrate has an underlying film underneath the metal compound film, the underlying film including a silicon nitride film.

21. A substrate processing method comprising:
providing a substrate including a metal compound film and a mask defining an opening on the metal compound film to a plasma processing chamber; and
etching the metal compound film by forming a plasma from a first processing gas including a boron- and halogen-containing gas and $H_2$ gas, a ratio of volume of the $H_2$ gas to a total volume of the boron- and halogen-containing gas and $H_2$ gas being from 10% to 15%,
wherein the metal compound film is formed from an oxide, nitride, silicate, or oxynitride of Hf, Ta, Ti, Al, Y, La, W, Mo, Ni, Ru, or Co, and
wherein the metal compound film includes $Al_2O_3$ or $HfO_2$.

* * * * *